(12) United States Patent
Jang et al.

(10) Patent No.: US 9,580,803 B2
(45) Date of Patent: Feb. 28, 2017

(54) THIN FILM DEPOSITION DEVICE AND METHOD OF DEPOSITING THIN FILM USING THEREOF

(71) Applicant: Samsung Display Co., Ltd., Yongin-si, Gyeonggi-do (KR)

(72) Inventors: Cheol Jang, Uiwang-si (KR); Jin Koo Kang, Ansan-si (KR); Soo Youn Kim, Siheung-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/932,742

(22) Filed: Nov. 4, 2015

(65) Prior Publication Data

US 2016/0289829 A1 Oct. 6, 2016

(30) Foreign Application Priority Data

Mar. 30, 2015 (KR) .................. 10-2015-0044361

(51) Int. Cl.
*H01L 23/62* (2006.01)
*C23C 16/455* (2006.01)
(Continued)

(52) U.S. Cl.
CPC .... *C23C 16/45544* (2013.01); *C23C 16/4583* (2013.01); *H01L 21/0228* (2013.01);
(Continued)

(58) Field of Classification Search
CPC ............. H01L 21/0228; H01L 21/0262; H01L 21/28556; H01L 21/762; H01L 21/3141; H01L 27/1251; H01L 29/4908; H01L 51/0508; H01L 51/5287
USPC ... 257/40, 79, 359, 347, 396, 411, 622, 760, 257/E21.006, E21.053, E21.267, 257/E21.311, E21.32, E21.319
See application file for complete search history.

(56) References Cited

U.S. PATENT DOCUMENTS 7,098,085 B2 * 8/2006 Yamanaka .......... H01L 27/1285
438/149
7,387,686 B2 * 6/2008 Iwamoto .......... C23C 16/45527
118/729
(Continued)

FOREIGN PATENT DOCUMENTS

JP 2000-319772 A 11/2000
KR 10-2010-0002886 A 1/2010
(Continued)

*Primary Examiner* — David Nhu
(74) *Attorney, Agent, or Firm* — Knobbe Martens Olson & Bear LLP

(57) ABSTRACT

A thin film deposition device and a method of depositing thin film materials are disclosed. In one aspect, the thin film deposition device includes a deposition chamber configured to accommodate a substrate and a first chamber plate placed in the deposition chamber and configured to mount the substrate on a first surface thereof. The thin film deposition device also includes a second chamber plate placed in the deposition chamber on the opposite side of the first chamber plate with reference to the substrate. A plurality of recesses are formed on a surface of the second chamber plate facing the first surface of the first chamber plate such that gas flow is formed through the respective recesses.

20 Claims, 11 Drawing Sheets

(51) Int. Cl.
*H01L 21/683* (2006.01)
*H01L 21/02* (2006.01)
*H01L 21/285* (2006.01)
*C23C 16/458* (2006.01)

(52) U.S. Cl.
CPC .... *H01L 21/0262* (2013.01); *H01L 21/28556* (2013.01); *H01L 21/6831* (2013.01)

(56) References Cited

U.S. PATENT DOCUMENTS

2012/0125258 A1* 5/2012 Lee .................. C23C 16/45536
118/719
2012/0237695 A1* 9/2012 Pye ............................ C08J 7/08
427/554

FOREIGN PATENT DOCUMENTS

| KR | 10-2011-0078668 A | 7/2011 |
| KR | 10-2013-0113783 A | 10/2013 |

* cited by examiner

THIN FILM DEPOSITION DEVICE AND METHOD OF DEPOSITING THIN FILM USING THEREOF

RELATED APPLICATIONS

This application claims priority to and the benefit of Korean Patent Application No. 10-2015-0044361 filed in the Korean Intellectual Property Office on Mar. 30, 2015, the entire contents of which are incorporated herein by reference.

BACKGROUND

Field

The described technology generally relates to a thin film deposition device and method of depositing thin film materials.

Description of the Related Technology

A thin film manufacturing process, such as a thin film encapsulation of an organic light emitting device, generally uses a deposition process that generates steam from a deposition source for adsorption of the steam to the substrate surface.

Recently, atomic layer deposition (ALD), which can more uniformly and precisely form a thin film, has become the preferred deposition process for many applications. In ALD, a precursor is first adsorbed to the surface of a substrate and then a reactant is supplied and an atomic layer is formed from the chemical reaction between the precursor and the reactant.

Among generally used atomic layer deposition processes, one of these is a traveling wave-type atomic layer deposition process. Here, a substrate and a deposition mask are aligned in an atomic layer deposition chamber, steam from a deposition source is injected into the chamber, and the steam is controlled to be adsorbed to the surface of the substrate while being moved through an outlet. However, in this process, a large mother substrate is generally used to improve productivity, and thus when steam is injected into a large-sized deposition chamber (sufficiently large to have the mother substrate), flow of the injected steam cannot be controlled. As a result, uniformity of the atomic layer deposited to the substrate may be degraded.

When ALD process time is extended so as to reduce the incidence of non-uniformities, a tact time (i.e., maximum process time) is inevitably extended, thereby reducing productivity. Further, steam flows through a gap between the deposition mask and the substrate, thereby causing deposition failure.

When a spatial-type ALD process is used, developed to improve deposition speed, different steam nozzles are alternately arranged above the substrate and deposition can be promptly performed while the substrate slides below the nozzle. However, a vapor cross current can occur between adjacent gas nozzles, and thus, foreign particles may lodge on the substrate, thereby causing deposition failure.

The above information disclosed in this Background section is only to enhance the understanding of the background of the invention, and therefore it may contain information that does not form the prior art that is already known in this country to a person of ordinary skill in the art.

SUMMARY OF CERTAIN INVENTIVE ASPECTS

One inventive aspect relates to a thin film deposition device for performing deposition on the surface of a target by generating steam from a deposition source.

Another aspect is an atomic layer deposition device using the deposition of an atomic layer, such as a display, a semiconductor, and the like, and an atomic layer deposition method using the same.

Another aspect is a thin film deposition device that can achieve excellent deposition uniformity and productivity, such as improved deposition speed, without using a deposition mask, and a thin film deposition method using the same.

Another aspect is a thin film deposition device that includes: a deposition chamber in which a substrate is inserted; a first chamber module provided in the deposition chamber and to which the substrate is mounted; and a second chamber module provided in the deposition chamber and placed in the opposite side of the first chamber module with reference to the substrate, and having two or more recess portions provided in the surface that faces opposite to the first chamber module, such that a flow of gas is formed through the respective recess portions.

The first chamber module may include a fixing portion that fixes the substrate to the first chamber module.

The fixing portion may include an electrostatic chuck.

The first chamber module may be provided above the second chamber module and the first chamber module may be vertically movable toward the second chamber module.

The second chamber module may further include a protrusion portion partitioning the two or more recess portions, and a sealing member may be provided in the upper surface of the protrusion portion.

The two or more recess portions may be arranged in a matrix format in the second chamber module.

The second chamber module may include: gas inlets, each being connected to one side of each of the two or more recess portion to supply a gas to the corresponding recess portion; and gas outlets, each being connected to the other side of each of the two or more recess portions to discharge a residual gas in the recess portion.

The gas may be at least one of a precursor gas, a reactance gas, and a purge gas.

Two or more gas inlets are provided at a distance from each other and respectively connected to the recess portions.

The precursor gas, the reactance gas, and the purge gas may be respectively supplied through different gas inlets.

Another aspect is a thin film deposition method that includes: injecting the substrate into a deposition chamber where a first chamber module and a second chamber module are provided; fixing and aligning the substrate to the first chamber module; mounting the substrate to the upper surface of the second chamber module where two or more recess portions are provided by lowering the first chamber module; and depositing the thin film on the substrate by supplying the gas to the recess portions.

The deposition of the thin film may include: supplying a precursor gas to the two or more recess portions to adsorb the precursor gas to the substrate; discharging the precursor gas by supplying a purge gas to each of the two or more recess portions; supplying a reactance gas to each of the two or more recess portions for reaction of the precursor adsorbed to the substrate and the reactance gas; and discharging the reactance gas by supplying the purge gas to each of the two or more recess portions.

The depositing of the thin film may include supplying one of the precursor gas, the reactance gas, and the purge gas simultaneously to the two or more recess portions.

The depositing of the thin film may include depositing a thin film on the bottom surface of the substrate.

Another aspect is a thin film deposition device comprising: a deposition chamber configured to accommodate a substrate therein; a first chamber plate placed in the deposition chamber and configured to mount the substrate on a first surface thereof; and a second chamber plate placed in the deposition chamber on the opposite side of the first chamber plate with reference to the substrate, wherein a plurality of recesses are formed on a surface of the second chamber plate facing the first surface of the first chamber plate such that gas flow is formed through the respective recesses.

In the above device, the first chamber plate comprises a fixing portion configured to fix the substrate to the first chamber plate. In the above device, the fixing portion comprises an electrostatic chuck. In the above device, the first chamber plate is positioned above the second chamber plate and wherein the first chamber plate is substantially vertically movable toward the second chamber plate. In the above device, the second chamber plate comprises a protrusion partitioning the recesses, and wherein the thin film deposition device further comprises a sealing material formed in the upper surface of the protrusion. In the above device, the recesses are arranged in a matrix format in the second chamber plate. In the above device, the second chamber plate comprises: a plurality of gas inlets, each being connected to one side of each of the recesses to supply a gas to the corresponding recess; and a plurality of gas outlets, each being connected to the other side of each of the recesses to discharge a residual gas in the recess. In the above device, the gas is at least one of a precursor gas, a reactance gas, and a purge gas. In the above device, the gas inlets are spaced apart from each other and are respectively connected to the recesses. In the above device, the precursor gas, the reactance gas, and the purge gas are respectively supplied through different gas inlets.

Another aspect is a method of depositing a thin film to a substrate, comprising: injecting the substrate to a deposition chamber where a first chamber plate and a second chamber plate are provided; fixing and aligning the substrate to the first chamber plate; descending the first chamber plate so as to mount the substrate to an upper surface of the second chamber plate where a plurality of recesses are provided; and supplying a gas to the recesses so as to deposit the thin film onto the substrate.

In the above method, the deposition of the thin film comprises: supplying a precursor gas to the recesses such that the precursor gas is absorbed into the substrate; supplying a purge gas to each of the recesses so as to discharge the precursor gas; supplying a reactance gas to each of the recesses for reaction of the precursor adsorbed into the substrate and the reactance gas; and supplying the purge gas to each of the recesses so as to discharge the reactance gas.

In the above method, the depositing of the thin film comprises supplying one of the precursor gas, the reactance gas, and the purge gas simultaneously to the recesses. In the above method, the depositing of the thin film comprises depositing a thin film on a bottom surface of the substrate.

Another aspect is a thin film deposition device comprising: a deposition chamber configured to accommodate a substrate therein; a first chamber plate placed in the deposition chamber and configured to mount the substrate on a first surface thereof; and a second chamber plate placed in the deposition chamber in an opposite side of the first chamber plate with reference to the substrate, wherein a plurality of recesses are formed are formed on a surface of the second chamber plate facing the first surface of the first chamber plate.

In the above device, two adjacent ones of the recesses are spaced apart by a protrusion. In the above method, the width of each of the recesses is greater than that of the protrusion. The above device further comprises a sealing material formed in the upper surface of the protrusion. In the above method, the recesses are substantially evenly spaced part. In the above device, the first chamber plate is positioned above the second chamber plate and wherein the first chamber plate is substantially vertically movable toward the second chamber plate.

At least one of the disclosed embodiments can perform a thin film deposition by controlling a contact form with the substrate according to the shape of a recess portion and the shape of a protrusion portion without using an additional deposition mask, and deposits a thin film on the bottom side of the substrate to prevent a foreign substance from being dropped from above the substrate due to gravity during the deposition process, thereby reducing deposition failure.

Furthermore, the gas inlets and the gas outlets are respectively provided in the recess portions, and thus thin film deposition can be performed in each unit substrate of each recess portion, even if a mother substrate is injected. Accordingly, the entire process time for deposition of the mother substrate can be shortened.

Moreover, since thin film deposition is performed for each recess portion having a comparatively small area, a flow of gas injected into each recess portion can be easily controlled, thereby improving deposition uniformity.

DETAILED DESCRIPTION OF CERTAIN INVENTIVE EMBODIMENTS

Figure 1:
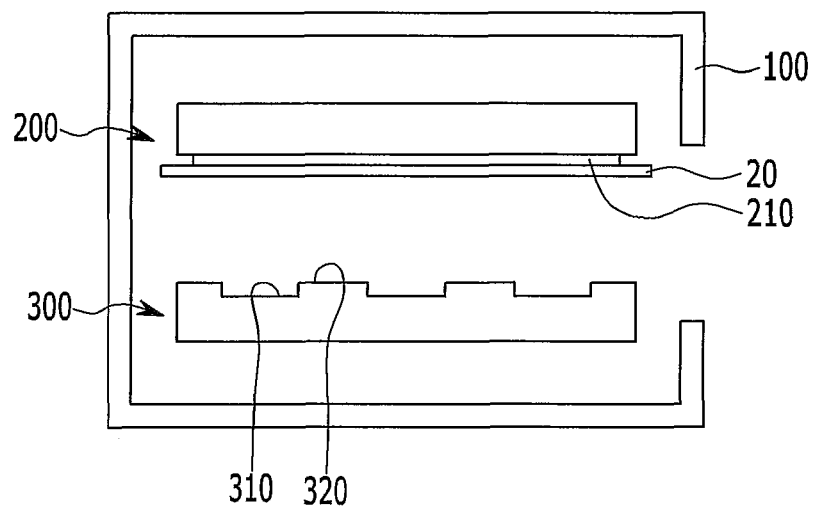
FIG. 1 shows a thin film deposition device according to an exemplary embodiment.

Hereinafter, exemplary embodiments will be described in detail with reference to the accompanying drawings so that those skilled in the technical field to which the described technology pertains may carry out the exemplary embodiments. As those skilled in the art would realize, the described embodiments may be modified in various different ways, all without departing from the spirit or scope of the described technology. The drawings and description are to be regarded as illustrative in nature and not restrictive. Like reference numerals designate like elements throughout the specification.

In the described technology, the word "on" means positioning on or below the object portion, but does not essentially mean positioning on the upper side of the object portion based on a gravitational direction.

In addition, throughout this specification and the claims which follow, unless explicitly described to the contrary, the word "comprise/include" or variations such as "comprises/includes" or "comprising/including" will be understood to imply the inclusion of stated elements but not the exclusion of any other elements.

In the description of the described technology, a thin film deposition device is exemplarily illustrated as a thin film deposition device that deposits a thin film formed in a display device, such as a thin film transistor, a thin film encapsulation layer, and a polarization thin-film that can be replaced with a polarizer, but the described technology is not limited thereto, and the thin film deposition device can be applied to various industries that require deposition of a thin film, such as a semiconductor and the like.

Further, in the description of the described technology, the thin film deposition device deposits an atomic layer thin film using an atomic layer deposition method, but usage of the thin film deposition device is not limited to such a method. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Hereinafter, a thin film deposition device 10 according to exemplary embodiments will be described with reference to FIG. 1 to FIG. 9.

FIG. 1 shows a thin film deposition device according to an exemplary embodiment.

Referring to FIG. 1, the thin film deposition device 10 deposits a thin film material to a substrate 20 into a deposition chamber 100. In some embodiments, the deposition chamber 100 includes a first chamber module (or a first chamber plate) 200, and a second chamber module (or a second chamber plate) 300.

The deposition chamber 100 includes a hollow hole formed therein, and has a semi-closed structure, of which one side is opened such that the substrate 20 is inserted therethrough. In addition, a door (not shown) may be provided to close the inside of the deposition chamber 100 during a deposition process. For performing an atomic layer deposition process, the inner surface of the deposition chamber 100 may be coated with a chemically safe material, and the deposition chamber 100 may be treated to maintain a vacuum state when closed, so as to be used for a sputtering process.

The deposition chamber 100 may be formed as a comparatively large-scaled structure, such that not only a unit substrate that forms an individual display module, but also a mother substrate including two or more unit substrates can be inserted therein.

The first chamber module 200 includes a fixing portion 210 to mount the substrate 20 inserted into the deposition chamber 100.

The fixing portion 210 may control the substrate 20 to be fixed to the first chamber module 200. The fixing portion 210 may include an electrostatic chuck that generates an electrostatic force, it may include a vacuum chuck that induces a high-degree vacuum, or it may include a vise that physically fixes at least one side of the substrate 20.

As shown in FIG. 1, the first chamber module 200 may be placed above the substrate 20 such that an upper portion of the substrate 20 is fixed by the first chamber module 200.

In addition, the first chamber module 200 may further include an alignment unit (not shown) to align the substrate 20 fixed by the fixing portion 210 to a desired location before performing the deposition process. Thus, the substrate 20 injected into the deposition chamber 100 can be fixed and pre-aligned before the deposition process.

Figure 2:
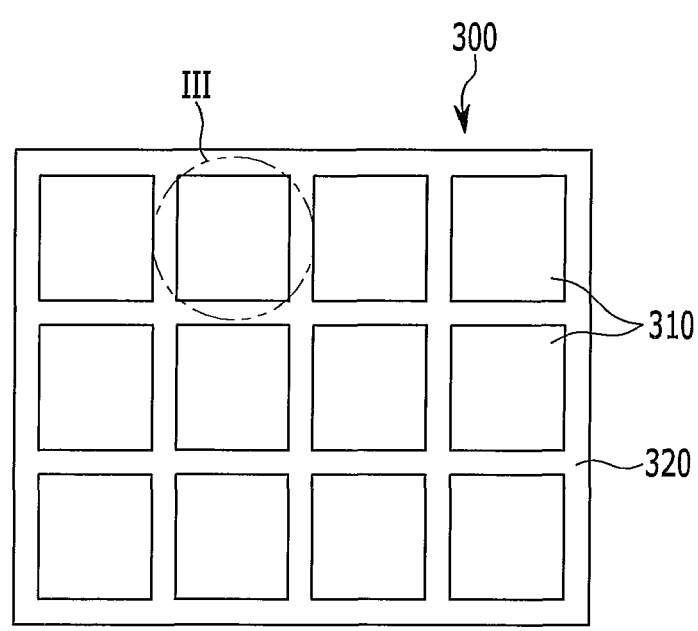
FIG. 2 is a top plan view of a second chamber module of a thin film deposition device according to the exemplary embodiment.
Figure 3:
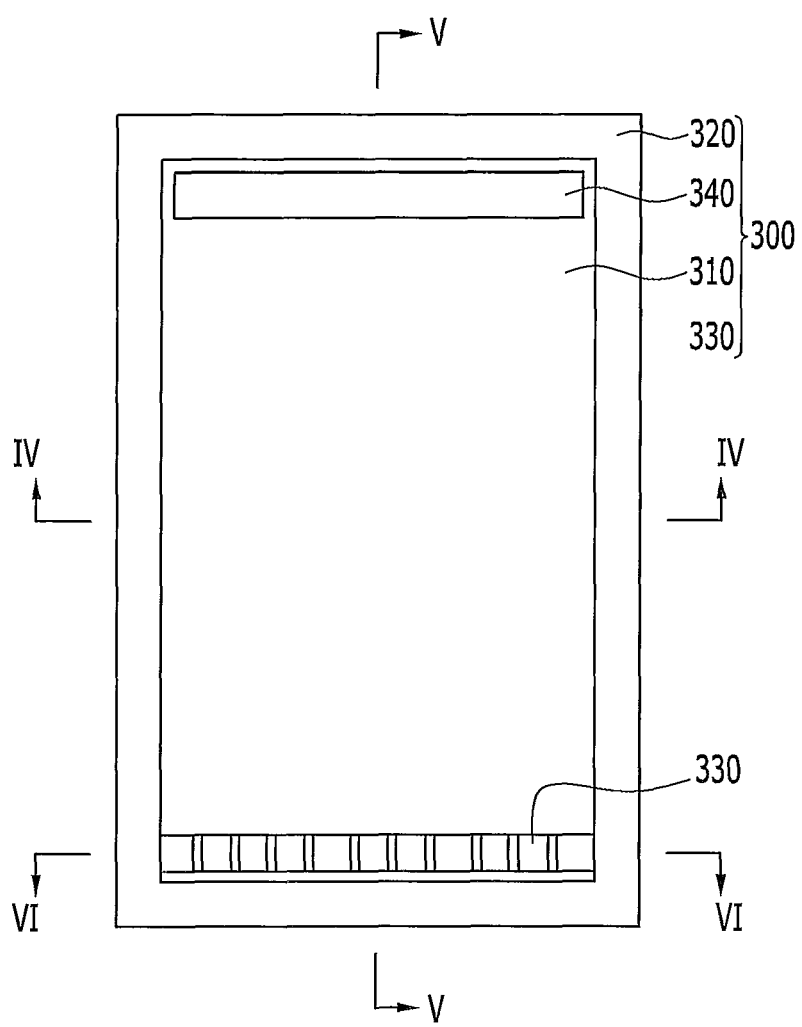
FIG. 3 is an enlarged view of part III in FIG. 2.

FIG. 2 shows a top plan view of the second chamber module of the thin film deposition device according to the exemplary embodiment, and FIG. 3 is an enlarged view of part III in FIG. 2.

As shown in FIG. 1, the second chamber module 300 is positioned in the opposite side of the first chamber module 200 with reference to the substrate 20. The second chamber module 300 may deposit a thin film on a lower side of the substrate 20 by spraying a precursor gas to the substrate 20 that is fixed and aligned by the first chamber module 200.

Accordingly, as the thin film is deposited on the lower side of the substrate 20, a foreign particle can be prevented from dropping on the upper portion of the substrate 20 due to gravity, thereby reducing deposition failure.

In the present exemplary embodiment, the second chamber module 300 is provided below the first chamber module 200 and the substrate 20, but the described technology is not limited thereto, and the location of the second chamber module 300 may be changed according to process conditions, such as a deposition process, deposition means, a deposition material, and the like.

Further, in the present exemplary embodiment, the first chamber module 200 may be connected to a vertical movement module (not shown), such as a cylinder member, a rack-pinion member, a cable member, and the like. Through the vertical movement module, the first chamber module 200 can vertically move toward the second chamber module 300. That is, since the first chamber module 200 is vertically movable, a vertical gap between the first and second chamber modules 200 and 300 can be controlled.

Figure 4:
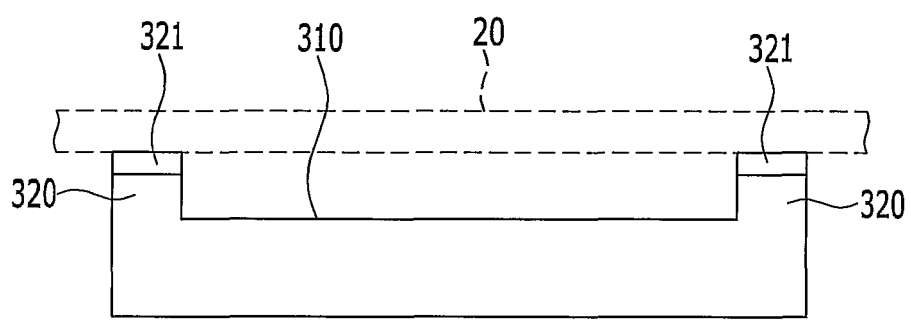
FIG. 4 is a cross-sectional view of FIG. 3, taken along the line IV-IV.
Figure 5:
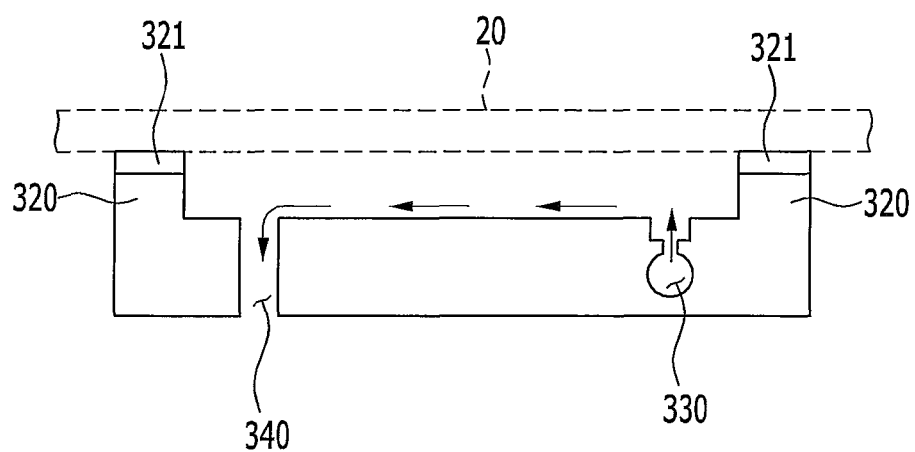
FIG. 5 is a cross-sectional view of FIG. 3, taken along the line V-V.
Figure 6:
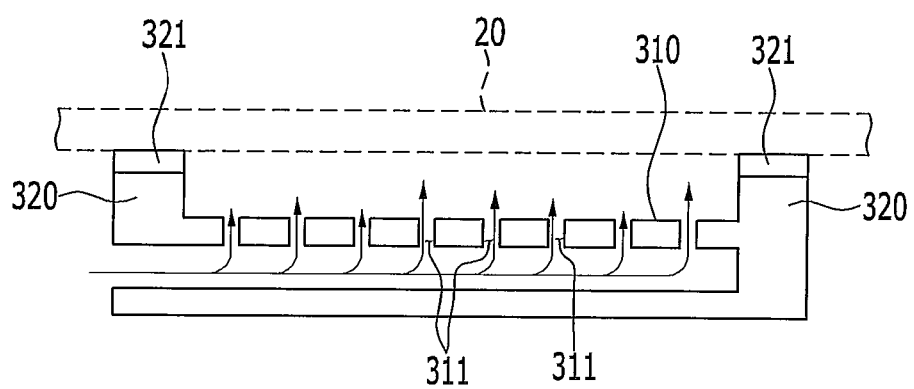
FIG. 6 is a cross-sectional view of FIG. 3, taken along the line VI-VI.

FIG. 4 is a cross-sectional view of FIG. 3, taken along the line IV-IV, FIG. 5 is a cross-sectional view of FIG. 3, taken along the line V-V, and FIG. 6 is a cross-sectional view of FIG. 3, taken along the line VI-VI.

Referring to FIG. 2 to FIG. 6, the second chamber module 300 may be placed substantially parallel to the first chamber module 200. The second chamber module 300 is connected to a gas supply source (not shown) for thin film deposition, and thus a thin film can be deposited on the substrate 20 mounted to the second chamber module 300 according to lowering of the first chamber module 200.

Meanwhile, the second chamber module 300 includes a recess portion (or at least one recess) 310, a protrusion portion (or at least one protrusion) 320, a gas inlet 330, and a gas outlet 340.

At least one recess portion 310, e.g., two or more recess portions, is formed in the surface that is opposite to the first chamber module 200. As shown in FIG. 2, the recess portion 310 may be arranged in a matrix format. The cross-section shape of the recess portion 310 may be a quadrangle, but it is not limited thereto. The cross-section shape of the recess portion 310 may conform to the shape of a cross-section of the unit substrate or cross-sectional area of the unit substrate.

As shown in FIG. 4, each recess portion 310 forms a closed space by contacting the substrate 20, and in the present exemplary embodiment, each unit substrate cross-section, or two or a set of cross-sections of more adjacent unit substrates, may correspond to each cross-section of the recess portion 310. That is, each recess portion 310 partitions the lower portion of the substrate 20 into smaller units as contacting the substrate 20.

In the present exemplary embodiment, the gas inlet 330 and the gas outlet 340 are provided in each recess portion 310 such that a gas flow is formed in the recess portion 310, but thin film deposition may be simultaneously or concurrently performed in each area of the substrate 20 partitioned by each recess portion 310.

That is, in the present exemplary embodiment, the two or more recess portions 310 may serve as openings of a deposition mask such that surfaces of the substrate 20 that need deposition can be selectively exposed.

As shown in FIG. 2, the protrusion portion 320 protrudes upward from the second chamber module 300 to respectively partition two or more recess portions 310. The shape of the protrusion portion 320 is a grid shape corresponding to the matrix arrangement of the recess portions 310. The protrusion portion 320 directly contacts the bottom surface of the substrate 20 when the first chamber module 200 descends.

That is, the protrusion portion 320 according to the present exemplary embodiment serves as a mask frame of the deposition mask that directly contacts the substrate 20.

The protrusion portion 320 may include a sealing member (or a sealing material) 321 formed on the upper surface thereof, such that the bottom surface of the substrate 20 can be mounted to the upper portion of the protrusion portion 320. Thus, in the thin film deposition process, the substrate 20 can be prevented from being separated from the second chamber module 300 and at the same time separation between the substrate 20 and the second chamber module 300 can be prevented. That is, in the present exemplary embodiment, a space formed by each recess portion 310 and the substrate 20 can be more firmly closed and sealed by the sealing member 321.

As shown in FIG. 3 and FIG. 5, the gas inlet 330 may be connected to the lower side of each recess portion 310. As shown in FIG. 6, a plurality of openings are formed in the gas inlet 330, and therefore a precursor gas, a reactance gas, and an purge gas that is needed for thin film deposition, such as argon (Ar), nitrogen (N), and the like, can be supplied to each recess portion 310 through the respective openings.

When one gas inlet 330 is provided in each recess portion 310, as in the present exemplary embodiment, the precursor gas, the reactance gas, and the purge gas may be sequentially supplied to the recess portion 310 through the gas inlet 330 according to the thin film deposition process.

The gas outlet 340 may be connected to a lower side of each recess portion 310. As shown in FIG. 3, the gas outlet 340 is placed at a distance from the gas inlet 330. Thus, as shown in FIG. 5 and FIG. 6, the gas injected into the recess portion 310 can remain for a relatively long period of time in the recess portion 310 rather than being discharged through the gas outlet 340, thereby improving deposition efficiency.

Accordingly, the thin film deposition device 10 can control the format of contact with the substrate 20 according to the shape of the recess portion 310 and the shape of the protrusion portion 320 without using an additional deposition mask for deposition.

Further, in the thin film deposition device 10 according to the exemplary embodiment, the gas inlet 330 and the gas outlet 340 are provided in each recess portion 310, and thus even if a mother substrate is injected into the thin film deposition device 10, thin film deposition can be performed in each recess portion 310, and accordingly thin film deposition for a desired unit area, such as a unit substrate, can be performed. Accordingly, the entire deposition process time can be shortened when a mother substrate is injected.

Since the thin film deposition process can be performed for each recess portion 310, which has a comparatively small cross-section, a flow of gas injected into each recess portion 310 can be easily controlled, thereby improving deposition quality.

Hereinafter, a thin film deposition device according to a second exemplary embodiment will be described with reference to FIG. 7. In description of the second exemplary embodiment, the same constituent elements of the thin film deposition device 10 according to the above-stated exemplary embodiment will not be described.

Figure 7:
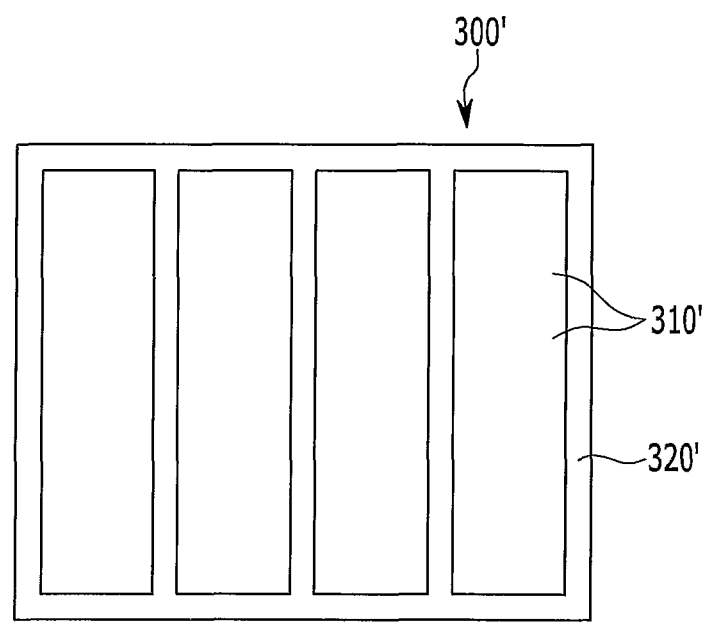
FIG. 7 is a top plan view of a second chamber module of a thin film deposition device according to a second exemplary embodiment.

FIG. 7 is a top plan view of a second chamber module of a thin film deposition device according to the second exemplary embodiment.

Referring to FIG. 7, recess portions 310' of the second chamber module 300' are arranged in a row and a protrusion portion 320' is also formed to partition each recess portion 310'. Further, a cross-section of each recess portion 310' may be different from the area of the above-stated recess portion 310.

As described, since the shape of cross-section and the cross-sectional area of each recess portion 310' of the second chamber module 300' can be variously changed, a mother substrate can be partitioned into additional various unit areas and a thin film deposition process can be performed.

Hereinafter, referring to FIG. 8 and FIG. 9, a thin film deposition device according to a third exemplary embodiment will be described. In description of the third exemplary embodiment, the same constituent elements of the thin film deposition device 10 according to the above-stated exemplary embodiment will not be described.

Figure 8:
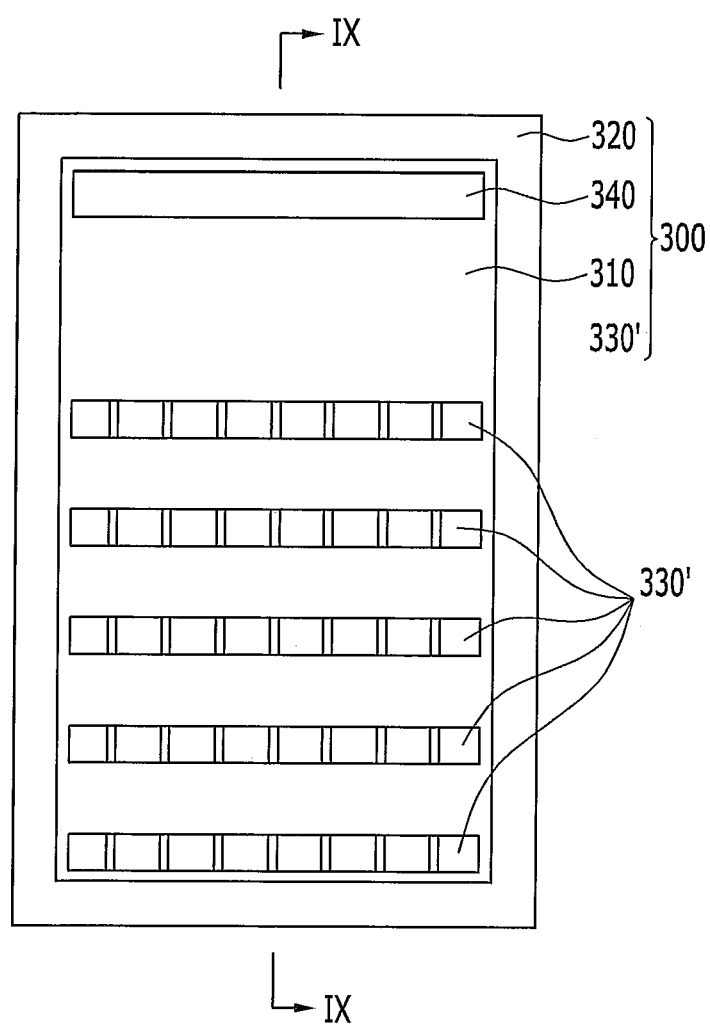
FIG. 8 is an enlarged view of a second chamber module of a thin film deposition device according to a third exemplary embodiment.
Figure 9:
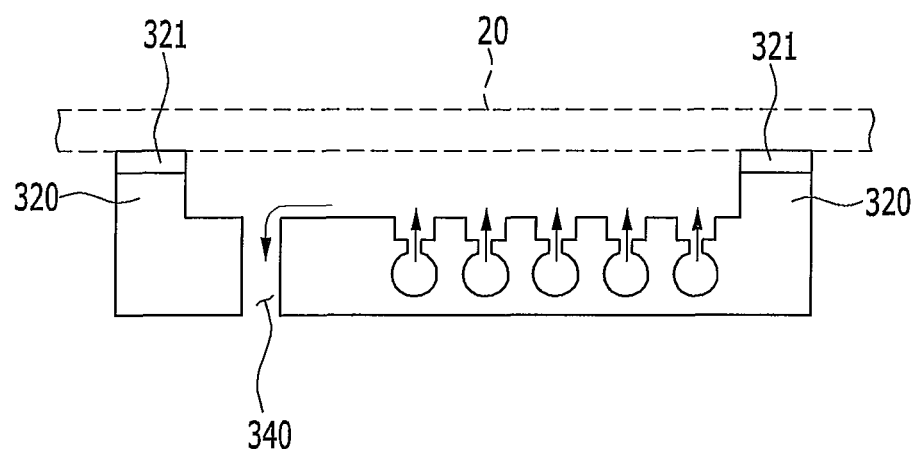
FIG. 9 is a cross-sectional view of FIG. 8, taken along the line IX-IX.

FIG. 8 is an enlarged view of a second chamber module of a thin film deposition device according to the third exemplary embodiment, and FIG. 9 shows a cross-sectional view of FIG. 8, taken along the line IX-IX.

The thin film deposition device according to the third exemplary embodiment is the same as the previously described thin film deposition device 10, except that two or more gas inlets 330' are connected to a recess portion 310.

As described, since two or more gas inlets 330' are connected to each recess portion 310, different types of gas can be supplied to the recess portions 310 using respective corresponding gas inlets. That is, when a precursor gas, a reactance gas, and an purge gas need to be sequentially supplied according to an atomic layer deposition process, three gas inlets 330' are formed for each recess portion 310 such that the three different gasses can be supplied through respective gas inlets.

When two or more types of precursor gasses are required according to a process, the number of gas inlets 330' may be changed to sequentially supply the two different types of precursor gasses, a reactance gas, and a purge gas through the respective gas inlets 330'.

That is, the number of gas inlets 330' of the thin film deposition device according to the third exemplary embodiment can be variously changed according to a thin film deposition process, and therefore a residual precursor and reactance can be prevented from being stuck on the inner wall due to mixed use of the gas inlets 330', thereby preventing the gas inlet 330' from being blocked.

Hereinafter, a thin film deposition method according to an exemplary embodiment will be described with reference to FIG. 10 and FIG. 11, and the thin film deposition devices of FIG. 1 to FIG. 6.

Figure 10:
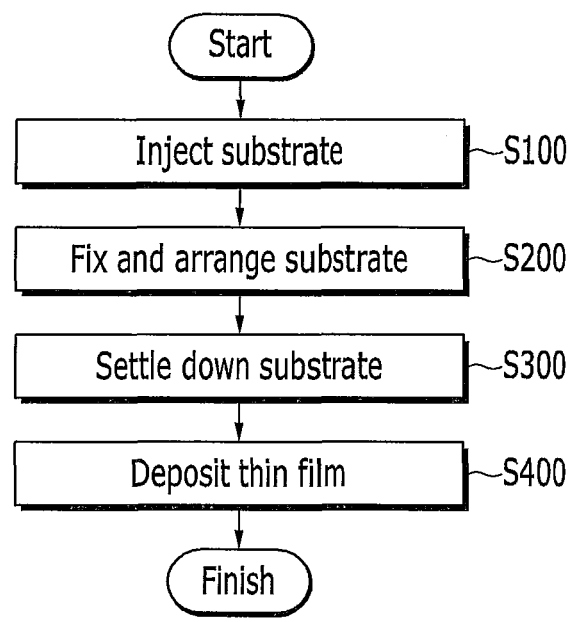
FIG. 10 is a flowchart of a thin film deposition method according to an exemplary embodiment.
Figure 11:
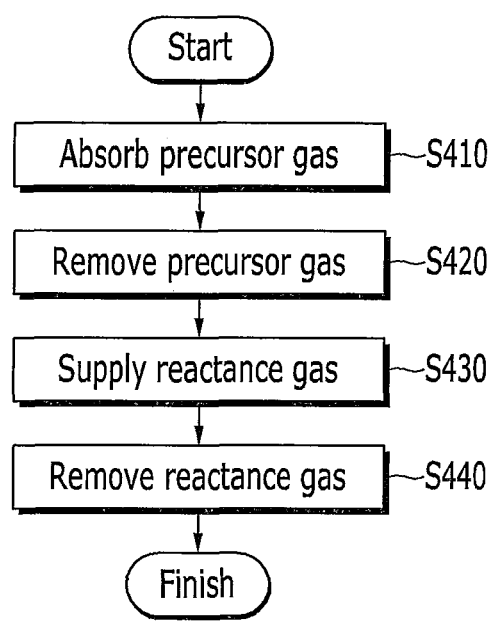
FIG. 11 is a flowchart of a detailed process of the thin film deposition process of the thin film deposition method according to the exemplary embodiment.

FIG. 10 is a flowchart of a thin film deposition method according to an exemplary embodiment and FIG. 11 is a flowchart of a detailed process of a thin film deposition process of the thin film deposition method according to one exemplary embodiment. Depending on embodiments, additional states may be added, others removed, or the order of the states changed in the procedure of FIG. 10. This applies to the FIG. 11 embodiment.

Referring to FIG. 10, the thin film deposition method includes injecting a substrate into a deposition chamber (S100), fixing and aligning the substrate to a first chamber module (S200), mounting the substrate to the upper surface of a second chamber module by lowering the first chamber module (S300); and depositing a thin film on the substrate by supplying a gas to a recess portion (S400).

In the injection of the substrate (S100), the substrate 20 is injected into the deposition chamber 100. In the present exemplary embodiment, the substrate 20 may be a mother substrate including two or more unit substrates. In this case, the first chamber module 200 in the deposition chamber 100 is placed above the second chamber module 300 at a distance therefrom.

In the fixing and aligning of the substrate (S200), the injected substrate 20 is fixed using the fixing portion 210. In this case, as shown in FIG. 1, the upper surface of the substrate 20 is fixed by the fixing portion 210 but the bottom surface thereof faces toward the second chamber module 300. Next, a detailed position of the substrate 20 is aligned to make locations of the recess portions 310 correspond to locations of the two or more unit substrates through an alignment portion (not shown).

In the mounting of the substrate (S300), the first chamber module 200 is descended toward the second chamber module 300, such that the bottom surface of the substrate 20 contacts the sealing member 321 formed above the protrusion portions 320. Accordingly, each recess portion 310 forms a closed space by the substrate 20. Since a constant level of pressure is continuously applied to the lowered first chamber module 200, the substrate 20, and the protrusion portions 320 can be prevented from being separated.

In the thin film deposition (S400), a precursor gas, a reactance gas, and a purge gas are sequentially supplied to the closed spaces formed by the respective recess portions 310 and the substrate 20 through the gas inlets 330. In particular, the gas inlet 330 and the gas outlet 340 are provided in each recess portion 310 in the present exemplary embodiment, and accordingly, thin film deposition can be simultaneously performed in the respective recess portions 310.

In the present exemplary embodiment, as shown in FIG. 11, the detailed thin film deposition process (S400) using an atomic layer deposition method as shown in FIG. 11 may further include adsorbing a precursor gas substrate (S410), eliminating the precursor gas (S420), supplying a reactance gas (S430) and eliminating the reactance gas (S440).

In the adsorbing of the precursor gas substrate (S410), a precursor gas is supplied to the recess portion 310 through the gas inlet 330 after the mounting of the substrate (S300). The supplied precursor gas remains in the closed space formed by the recess portion 310 and the substrate 20 to adsorb a precursor material in the bottom surface of the substrate 20 until being discharged to the outside of the recess portion 310 through the gas outlet 340. Meanwhile, when the precursor material is sufficiently adsorbed to the substrate 20, the supply of the precursor gas through the gas inlet 330 is stopped.

In eliminating the precursor gas substrate (S420), a purge gas such as argon (Ar), nitrogen (N), and the like is supplied to the recess portion 310 through the gas inlet 330 to discharge the precursor gas remaining in the closed space formed by the recess portion 310 and the substrate 20 through the gas outlet 340. Thus, the precursor gas can be prevented from remaining in the thin film formed on the bottom surface of the substrate 20, thereby improving thin film uniformity.

When two or more types of precursor gasses are required in the thin film deposition process, a second precursor gas is supplied to the recess portion 310 after eliminating a first precursor gas through the precursor gas substrate elimination process (S420) to adsorb a second precursor to the bottom surface of the substrate 20 such that the two or more types of precursor gasses can be sequentially adsorbed to the bottom surface of the substrate 20.

Next, the reactance gas is supplied to the recess portion 310 through the gas inlet 330 in the supplying of the reactance gas (S430). The supplied reactance gas chemically reacts with the precursor material adsorbed to the bottom surface of the substrate 20 to form a thin film layer unit being discharged to the outside of the recess portion 310 through the gas outlet 340. Meanwhile, when the thin film is formed in the bottom surface of the substrate 20, supplying of the reactance gas through the gas inlet 330 is stopped.

In eliminating the reactance gas (S440), a purge gas is supplied to the recess portion 310 through the gas inlet 330 to discharge a residual reactance gas through the gas outlet 340.

Next, the first chamber module 200 is ascended and the substrate 20 is separated from the first chamber module 200 such that the substrate 20 having a thin film formed on the bottom surface thereof can be manufactured.

In a general thin film deposition process, a precursor gas and a reactance gas are directly sprayed to a comparatively large-sized mother substrate, and thus a flow of the injected gas cannot be easily controlled, thereby deteriorating deposition uniformity, and since the precursor gas and the reactance gas should be sprayed for a long period of time, a tact time is extended.

However, as previously described, according to exemplary embodiments, even if the mother substrate is injected, two or more recess portions 310 are provided to correspond to the respective unit substrates and accordingly the precursor gas and the reactance gas can be respectively sprayed to areas partitioned by each unit substrate. Accordingly, deposition uniformity can be improved and at the same time the precursor gas and the reactance gas can be sprayed selectively to needed areas for each unit substrate so that the tact time can be shortened and productivity can be improved.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A thin film deposition device comprising:
a deposition chamber configured to accommodate a substrate therein;

a first chamber plate placed in the deposition chamber and configured to mount the substrate on a first surface thereof; and a second chamber plate placed in the deposition chamber on the opposite side of the first chamber plate with reference to the substrate, wherein a plurality of recesses are formed on a surface of the second chamber plate facing the first surface of the first chamber plate such that gas flow is formed through the plurality of recesses.

2. The thin film deposition device of claim 1, wherein the first chamber plate comprises a fixing portion configured to fix the substrate to the first chamber plate.

3. The thin film deposition device of claim 2, wherein the fixing portion comprises an electrostatic chuck.

4. The thin film deposition device of claim 1, wherein the first chamber plate is positioned above the second chamber plate and wherein the first chamber plate is substantially vertically movable toward the second chamber plate.

5. The thin film deposition device of claim 1, wherein the second chamber plate comprises a protrusion partitioning the plurality of recesses, and wherein the thin film deposition device further comprises a sealing material formed in the upper surface of the protrusion.

6. The thin film deposition device of claim 1, wherein the plurality of recesses are arranged in a matrix format in the second chamber plate.

7. The thin film deposition device of claim 1, wherein the second chamber plate comprises:
   a plurality of gas inlets, each being connected to one side of each of the plurality of recesses to supply a gas to the corresponding recess; and
   a plurality of gas outlets, each being connected to the other side of each of the plurality of recesses to discharge a residual gas in the recess.

8. The thin film deposition device of claim 7, wherein the gas is at least one of a precursor gas, a reactance gas, and a purge gas.

9. The thin film deposition device of claim 8, wherein the gas inlets are spaced apart from each other and are respectively connected to the plurality of recesses.

10. The thin film deposition device of claim 9, wherein the precursor gas, the reactance gas, and the purge gas are respectively supplied through different gas inlets.

11. A method of depositing a thin film to a substrate, comprising:
   injecting the substrate to a deposition chamber where a first chamber plate and a second chamber plate are provided;
   fixing and aligning the substrate to the first chamber plate;
   descending the first chamber plate so as to mount the substrate to an upper surface of the second chamber plate where a plurality of recesses are provided, wherein the second chamber plate is placed in an opposite side of the first chamber plate with reference to the substrate; and
   supplying a gas to the plurality of recesses so as to deposit the thin film onto the substrate.

12. The method of claim 11, wherein the deposition of the thin film comprises:
   supplying a precursor gas to the plurality of recesses such that the precursor gas is absorbed into the substrate;
   supplying a purge gas to each of plurality of the recesses so as to discharge the precursor gas;
   supplying a reactance gas to each of the plurality of recesses for reaction of the precursor adsorbed into the substrate and the reactance gas; and
   supplying the purge gas to each of the plurality of recesses so as to discharge the reactance gas.

13. The method of claim 12, wherein the depositing of the thin film comprises supplying one of the precursor gas, the reactance gas, and the purge gas simultaneously to the plurality of recesses.

14. The method of claim 11, wherein the depositing of the thin film comprises depositing a thin film on a bottom surface of the substrate.

15. A thin film deposition device comprising:
   a deposition chamber configured to accommodate a substrate therein;
   a first chamber plate placed in the deposition chamber and configured to mount the substrate on a first surface thereof; and
   a second chamber plate placed in the deposition chamber in an opposite side of the first chamber plate with reference to the substrate, wherein a plurality of recesses are formed on a surface of the second chamber plate facing the first surface of the first chamber plate, and wherein the first chamber is placed above the substrate and the second chamber is placed below the substrate.

16. The thin film deposition device of claim 15, wherein two adjacent ones of the plurality of recesses are spaced apart by a protrusion.

17. The thin film deposition device of claim 16, wherein the width of each of the plurality of recesses is greater than that of the protrusion.

18. The thin film deposition device of claim 16, further comprising a sealing material formed in the upper surface of the protrusion.

19. The thin film deposition device of claim 15, wherein the plurality of recesses are substantially evenly spaced part.

20. The thin film deposition device of claim 15, wherein the first chamber plate is positioned above the second chamber plate and wherein the first chamber plate is substantially vertically movable toward the second chamber plate.

* * * * *